United States Patent [19]
Sullivan et al.

[11] Patent Number: 5,883,809
[45] Date of Patent: Mar. 16, 1999

[54] BEHAVIORAL LANGUAGE MODELS FOR TESTING AND VERIFICATION OF DIGITAL ELECTRONIC CIRCUITS

[75] Inventors: Ronald Joseph Sullivan, Elgin; Michael John Zroka, Marengo, both of Ill.

[73] Assignee: 3 Com Corporation, Santa Clara, Calif.

[21] Appl. No.: 688,818

[22] Filed: Jul. 26, 1996

[51] Int. Cl.$^6$ ..................................................... G06F 17/00
[52] U.S. Cl. ............................ 364/489; 364/488; 364/490
[58] Field of Search ..................................... 364/488–491

[56] References Cited

U.S. PATENT DOCUMENTS

| | | | |
|---|---|---|---|
| 4,542,505 | 9/1985 | Binoeder et al. | 371/1 |
| 4,590,581 | 5/1986 | Widdoes, Jr. | 364/578 |
| 4,916,647 | 4/1990 | Catlin | 364/578 |
| 4,937,765 | 6/1990 | Shupe et al. | 364/570 |
| 5,210,699 | 5/1993 | Harrington | 364/488 |
| 5,210,701 | 5/1993 | Hana et al. | 364/491 |
| 5,325,309 | 6/1994 | Halaviati et al. | 364/488 |
| 5,339,262 | 8/1994 | Rostoker et al. | 364/578 |
| 5,349,539 | 9/1994 | Moriyasu | 364/578 |
| 5,353,243 | 10/1994 | Read et al. | 364/578 |
| 5,426,770 | 6/1995 | Nuber | 395/500 |
| 5,452,227 | 9/1995 | Kelsey et al. | 364/489 |
| 5,459,673 | 10/1995 | Carmean et al. | 364/489 |
| 5,475,605 | 12/1995 | Lin | 364/488 |
| 5,541,849 | 7/1996 | Rostoker et al. | 364/489 |
| 5,555,201 | 9/1996 | Dangelo et al. | 364/489 |
| 5,598,344 | 1/1997 | Dangelo et al. | 364/489 |

OTHER PUBLICATIONS

T. Dillinger, VLSI Engineering, pp. 91–136, Prentice Hall (1988).

Kunz et al. "Recursive Learning: A New Implication Technique for Efficient Solution to CAD Problems–Test, Verification and Optimization," IEEE, pp. 1143–1158, Sep. 1994.

Swavely et al "A Generic VHDL Testbench to Aid in Development of Board–Level Test Programs," IEEE, pp. 231–241, Sep. 1994.

Microsoft Press, Computer Dictionary second edition, p. 251, 1994.

Fleurkens et al. "RVN–Time Consistency Checking in Discrete Simulation Models" IEEE pp. 223–227, Mar. 1995.

*Primary Examiner*—Kevin J. Teska
*Assistant Examiner*—Vuthe Siek
*Attorney, Agent, or Firm*—McDonnell Boehnen Hulbert & Berghoff

[57] ABSTRACT

A behavioral language-based methodology for the verification and testing of digital circuit designs. An automated or interactive simulation verification system can be used in accordance with the methodology to verify a digital circuit on inexpensive, simple digital circuit simulators, using behavioral languages, and achieve certain performance features found only on more costly, complex simulators.

16 Claims, 3 Drawing Sheets

TRUTH TABLE FOR
BEHAVIORAL LANGUAGE COMPARATOR, 34

| INPUTS | | OUTPUT |
|---|---|---|
| A | B | Y |
| 0 | 0 | 0 |
| 0 | 1 | 1 |
| 0 | HI-Z | 1 |
| 1 | 0 | 1 |
| 1 | 1 | 0 |
| 1 | HI-Z | 1 |
| HI-Z | 0 | 1 |
| HI-Z | 1 | 1 |
| HI-Z | HI-Z | 0 |

FIG. 4

```
-- SPECIAL ERROR DETECTION FUNCTION WHICH COMPARES SIMULATION OUTPUTS WITH EXPECTED OUTPUTS
-- SUPPLIED BY THE TEST VECTOR GENERATION SOFTWARE.
--
LIBRARY mgc_portable;
USE mgc_portable.qsim_logic.ALL;

ENTITY SIM_CMP IS
   PORT (      A , B   :   IN qsim_state;       -- input operands
          EN0Z, EN1, EN2 :  IN qsim_state;       -- input masks
                        ERR : OUT qsim_state ) ;

END SIM_CMP ;

ARCHITECTURE behav OF SIM_CMP IS
BEGIN
   ERR  <= '0' WHEN (EN0Z = '1')  OR (EN1 = '0') OR (EN2 = '0') OR          -- mask output if comparisons disabled
                  ( (EN0Z = '0')  AND (EN1 = '1') AND (EN2 = '1') AND       -- or, if comparisons enabled then
                    ( ((A = '0')  AND (B = '0'))  OR                        -- clear output if A = B = 0 or
                      ((A = '1')  AND (B = '1'))  OR                        --             if A = B = 1 or
                      ((A = 'Z')  AND (B = 'Z')) ) )     ELSE               --             if A = B = Z ....
                                                                            -- otherwise set the output to indicate
       '1';                                                                 -- error condition detected!
END behav ;
```

BEHAVIORAL LANGUAGE MODELS FOR TESTING AND VERIFICATION OF DIGITAL ELECTRONIC CIRCUITS

NOTICE RE: COPYRIGHT

A portion of the disclosure of this patent document contains matter subject to copyright protection. The copyright owner has no objection to the facsimile reproduction by anyone of the patent disclosure, as it appears in the Patent and Trademark Office files and records, but otherwise retains all copyright rights whatsoever.

BACKGROUND OF THE INVENTION

A. Field of the Invention

This invention relates generally to the design and testing of digital electronic circuits, and more particularly to the design and verification of customizable logic devices, such as Application Specific Integrated Circuits (ASICs).

B. Statement of Related Art

Digital electronic circuits may be designed using a variety of methods, which include, but are not limited to, schematic capture, VISIC Hardware Description Language (VHDL), Verilog® Hardware Description Language, and hand drawn schematic diagrams. Once a logic circuit is developed, it is desirable to simulate its performance by providing circuit stimulating test vectors as inputs to the circuit model. This simulation may be done using a variety of commercially available products, such as Mentor Graphics Quicksim II®, Ikos' hardware accelerator, Cadence Design Systems' Verilog XL® etc. Background references relating to the subject of design and verification of electronic circuits include U.S. Pat. Nos. 5,452,227; 5,349,539; 5,325,309; 4,590,581; and the textbook Thomas E. Dilinger, *VLSI Engineering*, Prentis Hall (1988), Chapter 4, pp. 91–135, which are incorporated by reference herein.

In designing digital electronic circuits, it is customary to validate and test the architecture and instruction set using a behavioral model of the circuit which implements this architecture. Later in the development process, lower level models such as a structural model and a Register Transfer (RTL) model may be designed. Behavioral models are useful in circuit design because certain statements in VHDL and Verilog are not directly synthesizeable from logic gates, and hence a complex software model, i.e., a behavioral model, must be built to model these circuits. In essence, the behavioral model is like a black box, as it generates the outputs of the circuit given a set of possible inputs.

As the design is simulated, the circuit outputs need to be examined in order to verify that they respond in the manner expected by the designer. This verification process may be performed many ways, including, but not limited to, visual inspection of ASCII data files, representing circuit outputs (tabular data files), visual inspection of graphical waveforms of circuit outputs, or any other method of determining circuit correctness. These verifications may be done either post-simulation, or interactively. In post simulation testing and verification, a complete simulation is performed, data is captured for all signals, and the data verified after simulation. In iterative testing and verification, the simulation is run for a short time, the simulation is paused in order to verify the current simulation output data, continue simulation, pause to verify new output data etc.

Systematic digital electronic circuit design and test techniques usually approach the design on a functional block by block basis. That is, one block is designed, simulated and verified, before proceeding to the next block. Also, all new blocks are designed, simulated and verified, before interconnecting with previously tested blocks. It becomes apparent that as each new block is added to the design, earlier blocks must also be re-verified to ensure they still function as desired and that they have not been effected by newly-added blocks.

The verification process can thus become very repetitive and tedious as the design increases in terms of size, function and complexity. It is thus desirable to provide an automated or semi-automated methodology for module verification.

Prior art simulation systems provide this capability through the use of additional designer-supplied signals referred to as expected outputs (EO). Each EO represents the logical value of each corresponding circuit output which is expected to result after the application of circuit input stimulus. This provides an answer-key-like pattern of what the correct response for each signal, over all simulation time, should be. When the circuit is simulated and verified, these simulators associate the EO with the respective signal and continuously compare them throughout the simulation. When a miscompare between the EO and its associated signal occurs, the simulator may respond appropriately. Appropriate responses may include, but are not limited to, incrementing a counter of all currently accumulated errors, halting simulation, pausing simulation, terminating simulation, generating an error report, etc. These responses depend on the type of verification (viz. interactive or post-processing) and the capabilities of the simulator.

This method of testing over all time is not always desirable, as it is very difficult and impractical to provide an exact representation of each signal under all conditions (i.e. different voltages, different temperatures, each affecting subtle timing shifts, causing the circuit output to differ from the EO). It is therefore desirable to partition the simulation into discrete simulation periods, each the same fixed duration long, and only verify the circuit output during a designer defined portion of this simulation period. For example, if a simulation period is defined as a 20 nS interval, the simulation period may be referred to, relative to the start of each period, as 0 nS (start)–20 nS (end). The actual verification time (also known as the "data strobe" or "strobe window") may take place only during, say, time 15 ns–19 ns. A strobe window, possibly different for each signal, would be able to be specified by the designer for every signal. This allows the designer to control when each signal is tested.

Additionally, a designer may not be interested in the output of a signal from one function, say function B, while the designer is verifying another function, say function A. In this manner the designer desires the ability to suppress a miscompare on demand or prevent an error condition from being detected. This technique is referred to herein as "masking" a signal output.

The object of this invention is to provide a system which performs automatic iterative digital circuit verification.

Another object of this invention is to provide a system which performs automatic circuit verification over all logic levels 1 (logic high), 0 (logic low), HI-Z (High impedance).

Another object of this invention to provide a testing and verification system permits designer-specified test parameters to increase the ease and efficiency of the testing and verification process. The present invention enables the designer to specify test periods, to specify verification strobe windows within a test period, and the capability to mask or prevent miscompares of individual signals at the designers discretion.

Another object of the invention is to decrease the time required to verify a circuit using these simulators, and while increasing the repeatability and completeness of each verification operation. This invention also enables less-sophisticated and less expensive simulators to use the teachings of the present invention to enjoy advanced features found only in more complex and costly simulators.

These and other objects, advantages and features of the present invention will be more apparent from the following detailed description of the preferred embodiment of the invention.

SUMMARY OF THE INVENTION

The present invention is a method for testing and verification of a digital electronic system, for example, an integrated digital electronic circuit. The method provides for stimulating the system with an input signal. The circuit under test generates an output signal in response to the input signal. A behavioral language comparator then compares the output signal with an expected output signal, typically of the form of a logic 0, 1 or high impedance or HI-Z level generated by the designer, for the given input signal. The behavioral language comparator then responsively generates an output signal indicative of whether an error condition exists within said system. Typically, the system that is being verified will be stimulated by up to N stimuli, and the comparison process with the expected outputs will be done simultaneously with multiple behavioral language comparators. These comparator output signals are supplied to a separate multiple-input comparison means for generating a master error condition signal referred to herein as MASTER COMPARE. If any one of the comparators generate an output signal indicative of an error condition (the ERROR signal herein), the master error condition signal (MASTER COMPARE) will indicate an error condition. Additionally, the invention provides for masking and strobe control of the testing and verification process to enhance the overall efficiency and usefulness of the testing and verification process. The designer can use these signals in order to pinpoint the source of the error.

This invention thus uses the capabilities of an HDL behavioral model to accept several designer defined signals and a circuit output signal, to perform controlled verification of the digital circuit. These designer defined signals provide the DL circuit information as to the test period start/end, test strobe window, mask control, and expected signal output value. The system uses these signals to determine if the state of the behavioral comparator error condition output signal, ERROR, should be asserted (i.e., ERROR CONDITION DETECTED) or not (i.e, NO ERROR CONDITION DETECTED). In the preferred embodiment, each ERROR output is logically OR'ed together to create a MASTER COMPARE signal. This MASTER COMPARE signal is asserted any time at least one ERROR signal is asserted by the behavioral language comparators. These individual ERROR signals and MASTER COMPARE signal may be used to respond to an error condition in a designer specified method.

BRIEF DESCRIPTION OF THE DRAWINGS

In the following description, reference will be made to the appended drawing figures, wherein like reference numerals refer to like elements in the various views, and wherein

FIG. 4 is a segment of VHDL source code for the behavioral language comparator of FIG. 2, describing the preferred embodiment of the signal comparator for a VHDL-based

DETAILED DESCRIPTION OF THE PREFERRED EMBODIMENT

Figure 1:
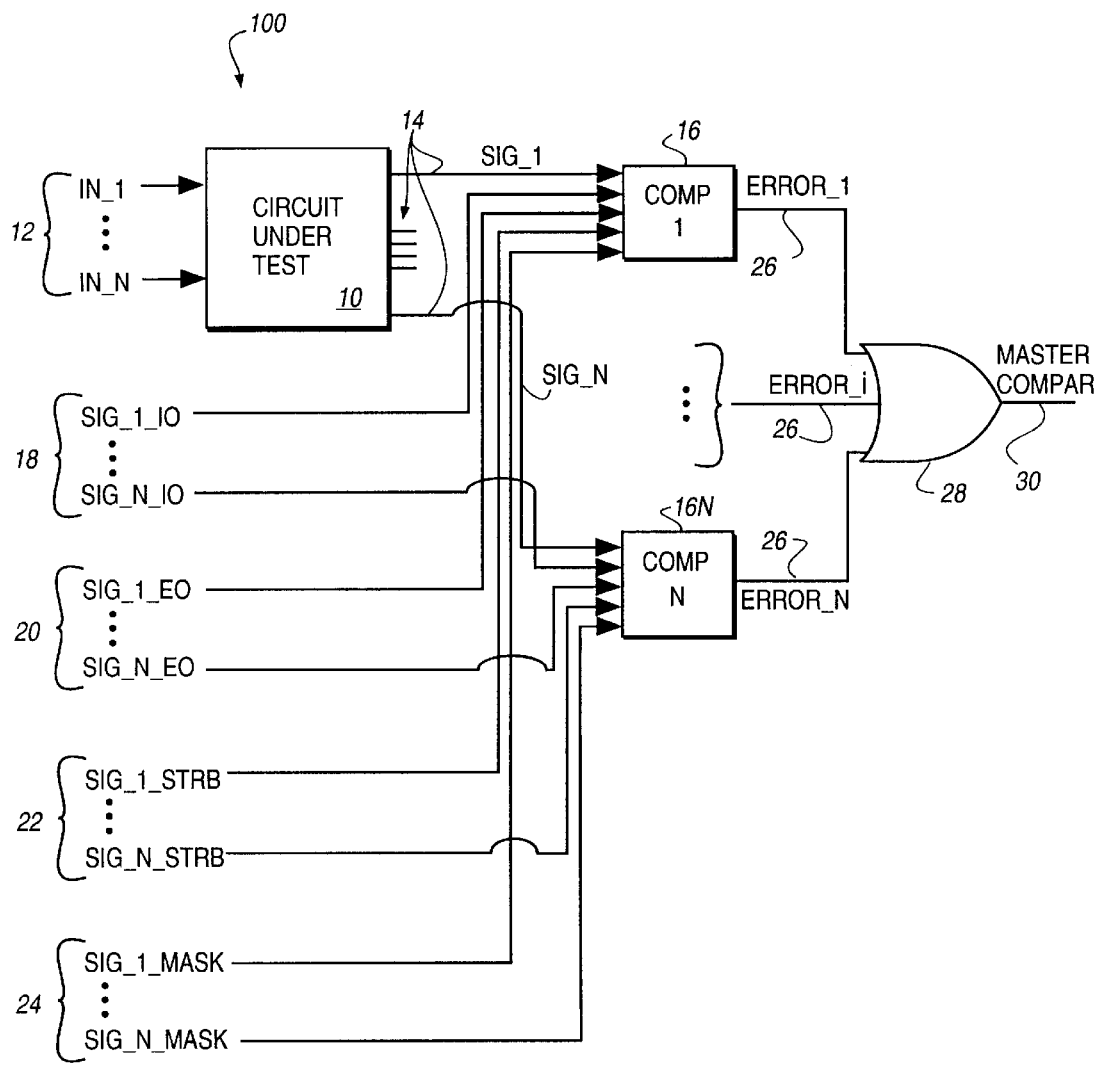
FIG. 1 is a block diagram of the verification system according to a preferred embodiment of the invention, showing the required designer supplied signals, the circuit-under-test, and the creation of separate ERROR and MASTER COMPARE signals.

Referring now to FIG. 1, a testing and verification system 100 for digital electronic circuits according to a preferred embodiment of the invention is shown schematically. The system 100 is designed to test and verify the design of a particular circuit under test 10. The nature or type of the circuit under test 10 is essentially unimportant, but for purposes of the present example is a custom-designed application specific integrated circuit (ASIC) for use, e.g., in a piece of telecommunications hardware.

The circuit under test 10 has a set of up to N stimulus input signals 12. In response, the circuit 10 generates up to N stimulus output signals 14. A set of up to N comparators 16 are provided. Each comparator 16 receives an output signal 14 from the circuit under test 10, a direction signal 18, and expected output signal 20, a strobe signal 22, and a mask signal 24. Each comparator 16 generates a specific error signal 26, which is supplied to a multiple input OR gate component 28, where the N error signals 26 are OR'd together to produce a MASTER COMPARE output 30.

In the present example, the designer supplies certain logic 0 or 1 mask, direction and strobe signals to each of the N comparators 16 of the testing and verification apparatus of FIG. 1 in order to conduct the testing and verification in an efficient manner. Additionally, the designer will supply expected output (EO) signals to the system in order to test whether the circuit is behaving as designed in accordance with the stimulus input signals 12.

Figures 2, 3:
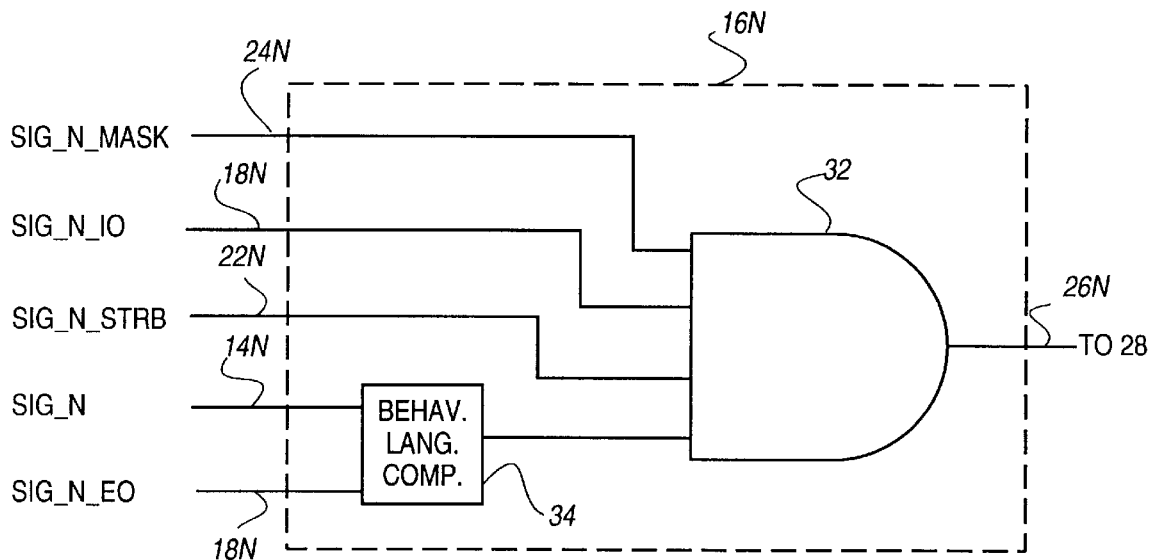
FIG. 2 is a block diagram of the Nth comparator of FIG. 1 showing the behavioral language comparator for the output and expected output signals SIG_1 and SIG_N, respectively.
FIG. 3 is a truth table for the behavioral comparator of FIG. 2.

In FIG. 1, all of the comparators 16 are of the same design and one of them (comparator N) is shown schematically in FIG. 2. The mask signal for the nth comparator SIG_N_MASK 24N, the direction signal SIG_N_IO 18N, and the strobe signal SIG_N_STRB 22N are all provided to a multiple input AND gate 32.

The output signal SIG_N 14N representing the logic output from the circuit under test 10 is compared with the expected output SIG_N_EO 20N in a behavioral language comparator 34. The signal SIG_N_EO 20N is supplied by the designer, and represents the logic levels expected of SIG_N_14N for all simulation time.

The output signals SIG_N_14N and SIG_N_EO 20N are behaviorally compared by the behavioral language comparator 34. This comparison is performed behaviorally in software to provide for the input signals being in the high-impedance(HI-Z) state. FIG. 3 shows a truth table description of this function for two inputs A, B which may each assume logic levels of 0, 1, or HI-Z. The output, Y, indicates the value of the comparator output when the inputs assume finite values. For example, the entry showing A=1, B=HI-Z, also shows output Y=1, indicating an error or miscompare, whereas the entry showing A =HI-Z, B =HI-Z, also shows output Y=0, indicating no error or miscompare. It is necessary that this comparison not be performed logically, as a HI-Z compared with either a logic 1 or logic 0 logically is undefined in an standard logic XOR gate. It is the behavioral model which gives control to the HI-Z comparisons resulting in either logic 0 or logic 1 as its output. The behavior model is preferably implemented in software, with a preferred source code therefore set forth in FIG. 4.

The result of this comparison (i.e., ERROR or NO_ERROR, represented by logic 0 or 1) is provided as the output 26N of the comparator 16N when selected by the AND gate element 32. This selection occurs when the SIG_N$_{13}$ MASK input 24N is logic 1 (unmasked), the SIG_N_IO 18N input is logic 1 (output mode) and the SIG_N_STRB 22N signal is logic 1 (strobe window active).

These signals are required to ensure that the signals SIG_N_EO 18N and SIG_N 14N are only compared when the designer does not desire to mask the output and prevent error suppression (SIG_N_MASK=1), the bi-directional signal is determined to be in output mode (SIG_N_IO=1) and the desired test point within the test period is active (i.e., SIG_N_STRB =1).

This method of comparison occurs for each output signal 14 from the circuit under test, along with the designer's associated signal set (signals 12, 18, 20, 22, 24 in FIG. 1). The resulting error signals from the N comparators 16 are ultimately combined in the multi-input OR gate 28. With this system, the designer may instruct the simulator 100 to generate an error condition whenever the MASTER COMPARE signal 30 is logic 1. To further refine the level of error detection, the designer could request the simulator to show the state of each comparator 16 output. These signals, normally logic 0 when no error condition is present, can be quickly searched to determine which signal(s) are logic 1 (i.e., error condition present). This permits the designer to quickly and accurately isolate which signal(s) are in error and take corrective action.

A preferred section of source code for use in implementing the behavior model for the comparators 34 is set forth in FIG. 4. It will be appreciated that the above system can be used either interatively or automatically in testing and verifying the subject test circuit during the development process. Additionally, the designer may use the strobe and/or mask signals as needed to test the circuit during discrete periods or to isolate one of the test output signals.

Persons of skill in the art will appreciate that various departures may be made from the details of the preferred embodiment described herein without departure from the spirit of the invention. This true scope and spirit of the invention is defined by the claims, to be interpreted in light of the foregoing.

We claim:

1. A method for testing and verification of the design of a digital electronic system comprising the steps of:
   stimulating said system with an input signal;
   said system generating an output signal responsive to said stimulation;
   comparing said output signal from said system with an expected output signal in software with a behavioral language comparator, wherein both said expected output signal and said output signal potentially have a state comprising a logic 0 state, a logic 1 state, and a high impedance state; and
   responsively generating an output signal from said behavioral language comparator indicative of whether an error condition exists within the design of said system, said behavioral language comparator implementing in software a truth table in which a comparison of either a logic 0, logic 1, or high impedance signal with a high impedance signal results in said output signal from said behavioral language comparator having a defined logic value indicative of whether an error condition exists within the design of said system.

2. The method of claim 1, wherein said digital electronic system comprises a digital electronic circuit.

3. The method of claim 1, wherein said behavioral language comparator comprises a software routine comparing said output and expected output signals.

4. The method of claim 1, wherein said method is performed iteratively in a series of tests of said digital electronic system during development of said digital electronic system.

5. The method of claim 2, wherein said method is performed using VISIC Hardware Description Language (VHDL).

6. The method of claim 3, further comprising the step of:
   comparing said output signal with said expected output signal under the control of a strobe signal to thereby test said digital electronic circuit in a discrete simulation period.

7. A method for testing and verification of the design of a digital electronic circuit, comprising the steps of:
   stimulating said circuit with stimulus input signals 1 . . . N, where N is an integer greater than or equal to 1;
   generating output response signals 1 . . . N respectively for said stimulus input signals;
   comparing each of said output response signals with an expected output signal for each of said output signals in software with behavioral language comparators 1 . . . N, wherein said output signals and said expected output signals potentially have a state consisting of a logic 1 state, a logic 0 state, and a high impedance state;
   responsively generating from said comparisons output signals 1 . . . N with said behavioral language comparators 1 . . . N, respectively, indicative of whether an error condition exists between said response output signals and said expected output signals; and
   determining from said output signals 1 . . . N whether an error condition exists within the design of said digital electronic circuit, said behavioral language comparators 1 . . . N each implementing in software a truth table in which a comparison of either a logic 0, logic 1, or high impedance signal with a high impedance signal results in an output signal from said behavioral language comparator having a defined logic value indicative of whether an error condition exists within the design of said digital electronic circuit.

8. The method of claim 7, wherein said expected output signals and said output signals have states consisting of either logic 0, 1 or high impedence.

9. The method of claim 7, wherein said method is performed iteratively in a series of tests of said circuit development of said circuit.

10. The method of claim 7, wherein said method is performed using VISIC Hardware Description Language (VHDL).

11. The method of claim 7, further comprising the step of:
    comparing said output signals with a strobe signal to thereby test said digital electronic circuit in a discrete simulation period.

12. Apparatus for conducting testing and verification of the design of a digital electronic circuit, comprising:

a software-based testing and verification controller supplying an input signal to said circuit, with said circuit responsively generating an output signal;

said testing and verification controller further generating an expected output signal for said circuit's response to said input signal, wherein said output signal and said expected output signal potentially have a state consisting of a logic 1 state, a logic 0 state, and a high impedance state; and a behavioral language comparator comparing in software said output signal and said expected output signal and responsively generating a first error condition signal for said circuit indicative of whether an error condition exists within said circuit in response to said input signal, said behavioral language comparator implementing in software a truth table in which a comparison of either a logic 0, logic 1, or high impedance signal with a high impedance signal results in said output signal from said behavioral language comparator having a defined logic value indicative of whether an error condition exists within the design of said digital electronic circuit.

13. The apparatus of claim 12, wherein said testing and verification controller further generates a mask signal indicative of an intentional suppression of testing of said circuit, said mask signal changeable between a first suppress testing state and a second testing state, and supplies said mask signal to a comparison means for combining said first error condition signal with said mask signal;

said comparison means combining said mask signal with said first error condition signal and responsively issuing a second error condition signal, said second error condition signal masking said error condition in said circuit when said mask signal is in said first suppress testing state and not masking said error condition when said signal is in said second testing state.

14. The apparatus of claim 12, wherein said testing and verification controller further generates a strobe signal indicative of testing period in which said circuit is to be tested, said strobe signal changeable between a first state indicative of a inactive test window and a second state indicative of an active test window, and supplies said strobe signal to a comparison means for combining said first error condition signal with said strobe signal;

said comparison means combining said strobe signal with said first error condition signal and responsively issuing a second error condition signal, said second error condition signal masking said error condition in said circuit when said strobe signal is in said first state indicative of an inactive test window and not masking said error condition when said signal is in said second state indicative of an active test window, whereby said second error condition signal indicates the presence of an error condition in said digital electronic circuit only when said strobe signal is in said second state.

15. The apparatus of claim 12, wherein said controller supplies N input signals and responsively generates N output signals from said circuit, and wherein said apparatus further comprises N behavioral comparators each comparing one of said N output signals with an expected output signal for said circuit in response to said input signals and responsively generating N error condition signals for said circuit.

16. The apparatus of claim 15, wherein said N error condition signals are supplied to a second comparison means for generating a master compare signal, said second comparison means generating a master error signal is any one of said N error condition signals are indicative of an error condition in said circuit.

* * * * *